United States Patent
Liu et al.

(10) Patent No.: US 9,257,311 B2
(45) Date of Patent: Feb. 9, 2016

(54) METHOD OF FABRICATING A SEMICONDUCTOR PACKAGE WITH HEAT DISSIPATING STRUCTURE HAVING A DEFORMED SUPPORTING PORTION

(71) Applicant: Siliconware Precision Industries Co., Ltd., Taichung (TW)

(72) Inventors: Shih-Yao Liu, Tantzu (TW); Yueh-Ying Tsai, Taichung (TW); Yong-Liang Chen, Taichung (TW)

(73) Assignee: Siliconware Precision Industries Co., Ltd., Taichung (TW)

(*) Notice: Subject to any disclaimer, the term of this patent is extended or adjusted under 35 U.S.C. 154(b) by 0 days.

(21) Appl. No.: 13/859,147

(22) Filed: Apr. 9, 2013

(65) Prior Publication Data

US 2014/0134805 A1    May 15, 2014

(30) Foreign Application Priority Data

Nov. 13, 2012    (TW) .............................. 101142158 A

(51) Int. Cl.
| | |
|---|---|
| *H01L 21/44* | (2006.01) |
| *H01L 21/48* | (2006.01) |
| *H01L 21/50* | (2006.01) |
| *H01L 21/56* | (2006.01) |
| *H01L 23/433* | (2006.01) |
| *H01L 23/00* | (2006.01) |

(52) U.S. Cl.
CPC .......... *H01L 21/565* (2013.01); *H01L 23/4334* (2013.01); *H01L 24/97* (2013.01); *H01L 2224/48091* (2013.01)

(58) Field of Classification Search
USPC ........... 438/122, 123, 117, 124, 126, 127, 33, 438/68, 113
See application file for complete search history.

(56) References Cited

U.S. PATENT DOCUMENTS

| | | | |
|---|---|---|---|
| 2007/0065984 A1* | 3/2007 | Lau et al. ...................... | 438/107 |
| 2012/0175812 A1* | 7/2012 | Ikeda et al. ............... | 264/272.13 |

* cited by examiner

*Primary Examiner* — A. Sefer
*Assistant Examiner* — Dilinh Nguyen
(74) *Attorney, Agent, or Firm* — Mintz Levin Cohn Ferris Glovsky and Popeo, P.C.; Peter F. Corless; Steven M. Jensen

(57) ABSTRACT

A method of fabricating a semiconductor package is provided, including: providing a heat dissipating structure having a heat dissipating portion, a deformable supporting portion coupled to the heat dissipating portion, and a coupling portion coupled to the supporting portion; coupling a carrier having a semiconductor element carried thereon to the coupling portion of the heat dissipating structure to form between the carrier and the heat dissipating portion a receiving space for the semiconductor element to be received therein; and forming in the receiving space an encapsulant that encapsulates the semiconductor element. The use of the supporting portion enhances the bonding between the heat dissipating structure and a mold used for packaging, thereby preventing the heat dissipating structure from having an overflow of encapsulant onto an external surface of the heat-dissipating portion.

8 Claims, 4 Drawing Sheets

FIG. 2A"

METHOD OF FABRICATING A SEMICONDUCTOR PACKAGE WITH HEAT DISSIPATING STRUCTURE HAVING A DEFORMED SUPPORTING PORTION

CROSS-REFERENCES TO RELATED APPLICATIONS

This application claims under 35 U.S.C. §119(a) the benefit of Taiwanese Application No. 101142158, filed Nov. 13, 2012, the entire contents of which is incorporated herein by reference.

BACKGROUND OF THE INVENTION

1. Field of the Invention

This invention relates to methods of fabricating a semiconductor package, and, more particularly, to a method of fabricating a semiconductor package having a heat dissipating structure.

2. Description of Related Art

A modern electronic product is compact-sized and low-profiled. With the rapid development of a semiconductor fabrication process, more and more electrical elements are allowed to be integrated into a chip. However, the electronic elements, when in operation, generate a great amount of heat, and the heat cannot be dissipated to a region outside of the chip because the encapsulant does not have well enough heat dissipating quality. Accordingly, the lifespan of the electronic elements is reduced. Therefore, how to dissipate the heat generated by the electronic elements effectively is an important issue in the art. In general, a heat dissipation is disposed above the chip to dissipating the heat generated by the chip to an ambient environment.

According to the prior art, a compression molding method is used during a packaging process, to disposed a heat dissipation on a chip, as shown in FIGS. 1A to 1D, which illustrate a method of fabricating a semiconductor package 1 according to the prior art.

As shown in FIG. 1A, a heat dissipation 11 is disposed on a side in a mold 10, and in physical contact with a surface of the mold 10.

As shown in FIG. 1B, a substrate 12 having a plurality of semiconductor elements 12 disposed thereon is disposed on another side in the mold 10 (i.e., an upper portion 101), and the semiconductor elements 121 are disposed between the substrate 12 and the heat dissipations 11. The semiconductor element 121 is electrically connected via a plurality of bonding wires 120 to the substrate 12.

As shown in FIG. 1C, an encapsulant 13 is then formed in a mold cavity 100 of the mold 10 to encapsulate the semiconductor element 121.

As shown in FIG. 1D, a singulation process (along a cutting path S) are performed after the encapsulant 13 is released from the mold 10, to form a plurality of semiconductor packages 1.

In the method according to the prior art, the heat dissipations 11 are not closely adhered to the mold 10. Accordingly, during the formation of the encapsulant 13, the encapsulant 13 will flow via a side of the heat dissipation 11 to an external surface of the heat dissipation 11 due to a capillarity phenomenon. In other words, a resin bleed phenomenon happens. After the encapsulant 13 is released from the mold 10, a residual encapsulant 13' still stays on the external surface of the heat dissipations 11, as shown in FIG. 1 D', and a semiconductor package 1' of poor quality is formed.

Therefore, how to overcome the problems of the prior art is becoming an urgent issue in the art.

SUMMARY OF THE INVENTION

In view of the problems of the prior art, the present invention provides a method of fabricating a semiconductor package, comprising: providing a heat dissipating structure having a heat dissipating portion, a deformable supporting portion coupled to the heat dissipating portion, and a coupling portion coupled to the supporting portion; coupling a carrier having a semiconductor element carried thereon to the coupling portion of the heat dissipating structure to form between the carrier and the heat dissipating portion a receiving space for the semiconductor element to be received therein; and forming in the receiving space an encapsulant that encapsulates the semiconductor element.

In an embodiment, the method further comprises, after forming the encapsulant, removing the coupling portion and the supporting portion.

In an embodiment, the heat dissipating portion has a groove.

In an embodiment, the heat dissipating portion is less than or equal to the coupling portion in size.

In an embodiment, the encapsulant is formed in a mold, and the mold has a clamping portion that clamps the carrier and the coupling portion and a mold cavity less than the heat dissipating structure in height.

In an embodiment, the mold has a plurality of perforations that absorb the heat dissipating portion of the heat dissipating structure by vacuum-pumping when the encapsulant is formed.

In an embodiment, the coupling portion has a first positioning portion, and the carrier has a second positioning portion corresponding to the first positioning portion.

In a method of fabricating a semiconductor package according to the present invention, the use of the supporting portion that is deformable enhances the bonding between the heat dissipating portion and a mold used for packaging, thereby preventing the heat dissipating structure from having an overflow of encapsulant onto an external surface of the heat-dissipating portion when the encapsulant is formed.

BRIEF DESCRIPTION OF DRAWINGS

The invention can be more fully understood by reading the following detailed description of the preferred embodiments, with reference made to the accompanying drawings, wherein.

DETAILED DESCRIPTION OF THE INVENTION

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

FIGS. 2A-2E are cross-sectional diagrams illustrating a method of fabricating a semiconductor package 2 according to the present invention.

Figure 1A:
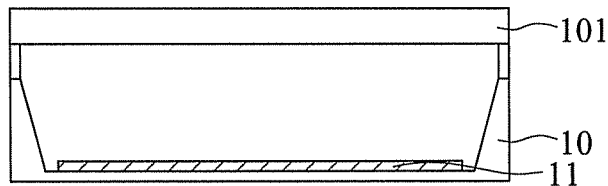
FIGS. 1A-1D are cross-sectional diagrams illustrating a method of fabricating a semiconductor package according to the prior art, wherein FIG. 1D' is an actual state of FIG. 1D.
Figure 1B:
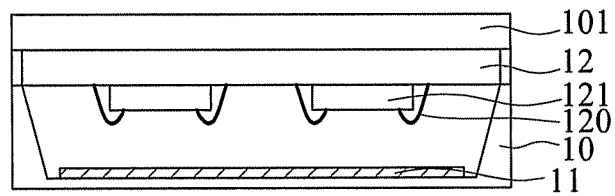
Figure 1C:
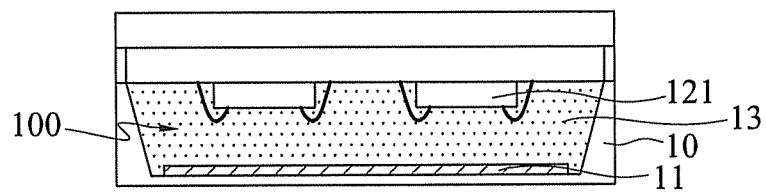
Figure 1D:
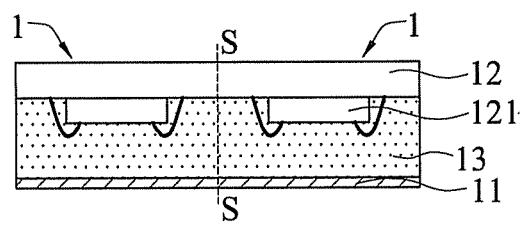
Figure 1D:
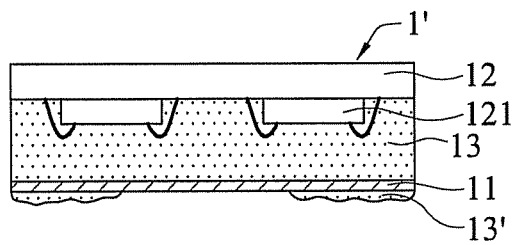
Figure 2A:
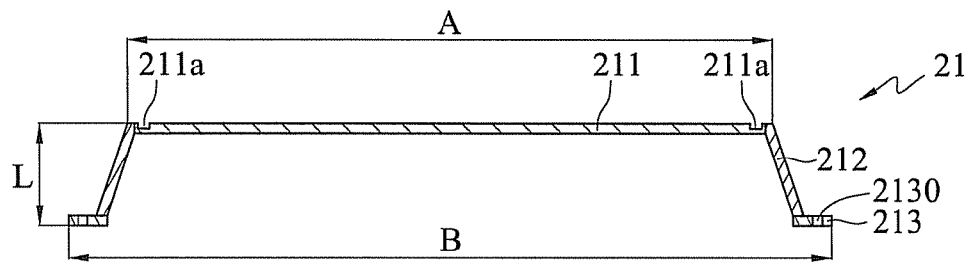
FIGS. 2A-2E are cross-sectional diagrams illustrating a method of fabricating a semiconductor package according to the present invention, wherein FIG. 2A' is a top view of FIG. 2A, FIG. 2A" is another embodiment of FIG. 2A, FIG. 2B' is another embodiment of FIG. 2B, and FIG. 2C' is another embodiment of FIG. 2C.
Figure 2A:
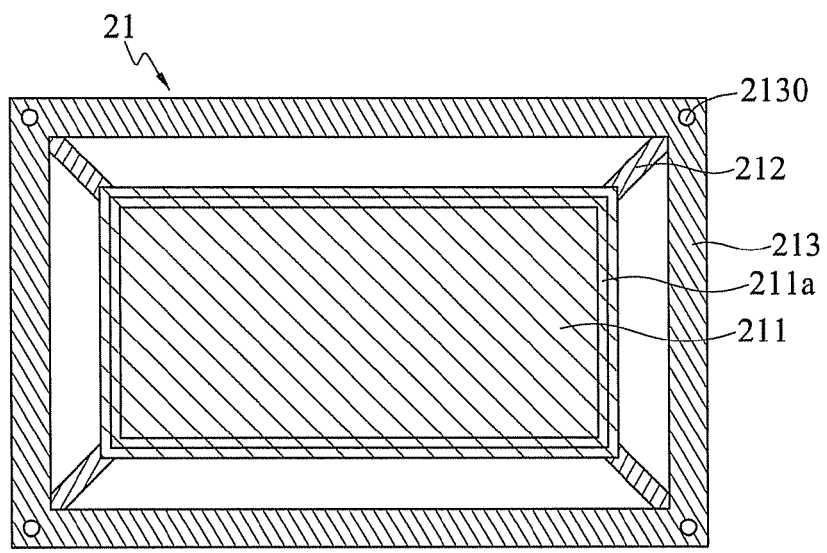

As shown in FIGS. 2A and 2A', wherein FIG. 2A' is a top view of FIG. 2A, an integrated heat dissipating structure 21 is provided that has a heat dissipating portion 211, a plurality of supporting portions 212 coupled to the heat dissipating portion 211, and a coupling portion 213 coupled to the supporting portions 212.

In an embodiment, the heat dissipating portion 211 has a groove 211a formed on an upper side thereof and surrounding a periphery of the heat dissipating portion 211, the heat dissipating structure 21 has four supporting portions 212, and the coupling portion 213 is a ring-shaped and has a first positioning portion 2130 (e.g., a positioning hole or other structures). In another embodiment, the heat dissipating structure 21 has the heat dissipating portion 211, the supporting portions 212 and the coupling portion 213, which are assembled individually. In other words, the heat dissipating structure 21 is not integrated. The heat dissipating structure 21 may have more supporting portions 212.

Figure 3:
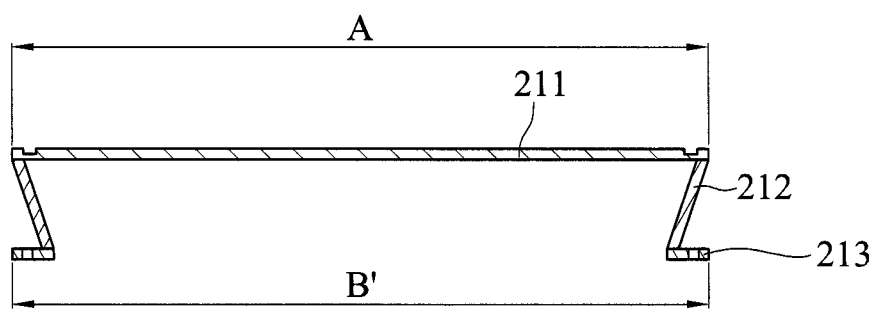
FIG. 3 is a cross-section diagram illustrating another embodiment of FIG. 2C.

In an embodiment, the size A (e.g., length and width) of the heat dissipating portion 211 is less than the size B (e.g., length and width) of an outer structure of the coupling portion 213, as shown in FIG. 2A'. In another embodiment, the size A of the heat dissipating portion 211 is equal to the size B' of the outer structure of the coupling portion 213, as shown in FIG. 3.

In an embodiment, the supporting portions 212 are deformable, and have their shapes or structures changed when an external force is applied to the heat dissipating structure 21. In an embodiment, the supporting portions 212 are made of any deformable material. In an embodiment, the supporting portions 212 have a flexible, bendable buffer structure. In the heat dissipating structure 21' shown in FIG. 2A'', the supporting portions 212' have a structure in the shape of a spiral, wave or the letter "S."

In an embodiment, the heat dissipating structure 21 defines a height L from the heat dissipating portion 211 to the coupling portion 213.

Figure 2B:
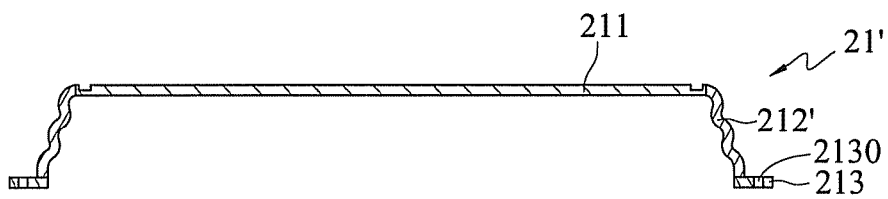
Figure 2B:
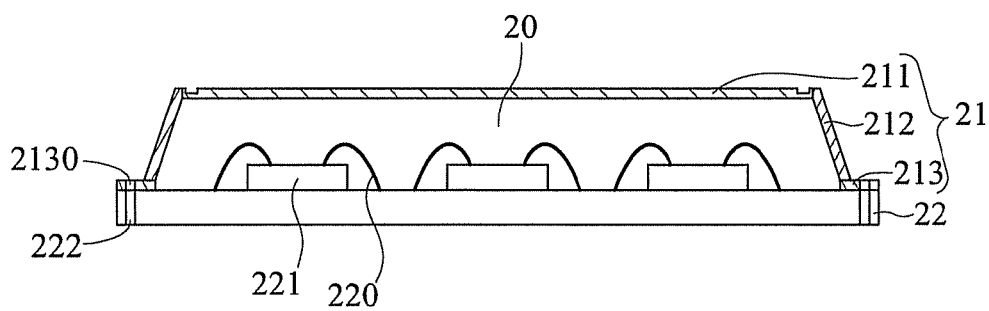
Figure 2B:
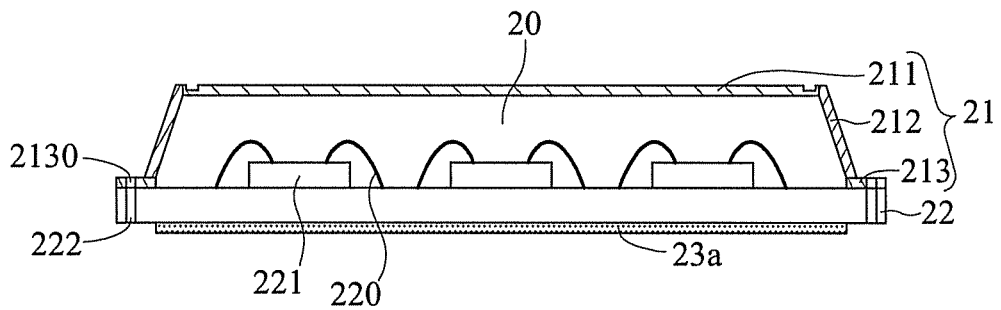

As shown in FIG. 2B, which shows a fabrication process subsequent to FIG. 2A, the coupling portion 213 of the heat dissipating structure 21 is attached to the carrier 22 via a resin material (not shown), a receiving space 20 is formed between the carrier 22 and the heat dissipating portion 211, and the carrier 22 has a plurality of semiconductor elements 221 disposed thereon and disposed in the receiving space 20.

In an embodiment, the carrier 22 is a lead frame. In another embodiment, the carrier 22 is a packaging substrate.

In an embodiment, each of the semiconductor elements 221 is electrically connected to the carrier 22 via a plurality of bonding wires 220. In another embodiment, the semiconductor elements 221 are electrically connected to the carrier 22 via conductive bumps in a flip-chip manner, for example.

In an embodiment, the carrier 22 has a second positioning portion 222 (e.g., a positioning hole or other structures) disposed on a periphery thereof and corresponding to the first positioning portion 2130. The carrier 22 can be aligned with and secured to the heat dissipating structure 222 by using the first positioning portion 2130 and the second positioning portion 222.

In an embodiment, as shown in FIG. 2B', a pre-molding 23a is formed on a bottom side of the carrier 22 before a packaging process is performed.

Figure 2C:
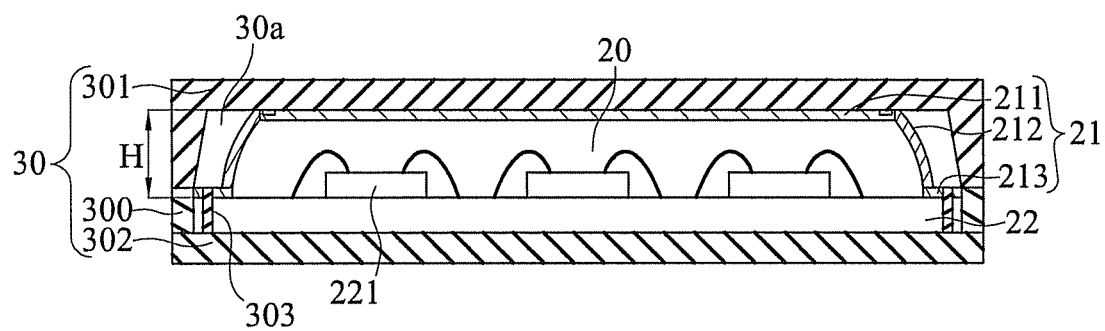
Figure 2C:
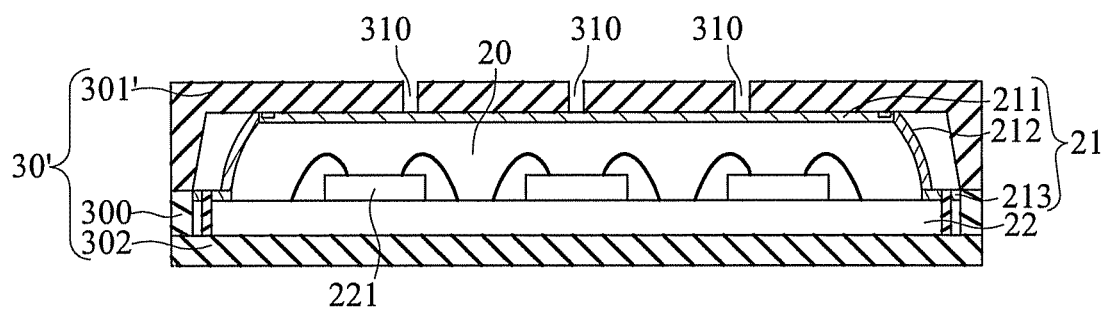

As shown in FIG. 2C, which shows a fabrication process subsequent to FIG. 2B, the heat dissipating structure 21 and the carrier 22 are placed in a mold 30.

In an embodiment, the mold 30 has an upper mold 301 and a lower mold 302, and the upper mold 301 and the lower mold 302 constitute a mold cavity 30a for a packaging material to be filled therein. When the mold 30 is closed, the height H of the mold cavity 30a is less than the height L defined by the heat dissipating structure 21. Since the supporting portions 212 are deformable and the supporting portions 212 are pressed by the upper mold 301 to deform when the upper mold 301 and the lower mold 302 is closed, the heat dissipating structure 21 and the carrier 22 can be placed in the mold 30. Besides, since the upper mold 301 presses downward to the heat dissipating portion 211, the heat dissipating portion 211 is coupled to upper mold 301 securely.

In an embodiment, the upper mold 301 has a clamping portion 300 that clamps left and right sides of the carrier 22 and the coupling portion 213. In specific, the height H of the mold cavity 30a is a distance between the clamping portion 300 and the lower surface of the upper mold 301.

In an embodiment, the upper mold 301 has a third positioning portion 303 (e.g., a pillar or other structures) corresponding to the first positioning portion 2130 and the second positioning portion 222. Therefore, the third positioning portion 303 can be coupled and locked to the first positioning portion 2130 and the second positioning portion 222, and the heat dissipating structure 21 and the carrier 22 can be placed in the mold cavity 30a accurately.

In an embodiment, as shown in FIG. 2C', a plurality of perforations 310 are formed on the upper mold 301', and absorb the heat dissipating portion 211 of the heat dissipating structure 21 by vacuum-pumping the mold 30' after the upper mold 301' is pressed to the lower mold 302. Therefore, the sealing between the heat dissipating portion 211 and the upper mold 301 is enhanced.

Figure 2D:
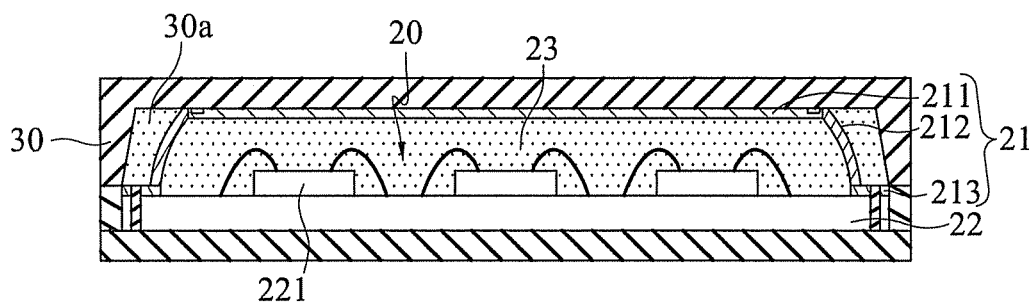

As shown in FIG. 2D, which shows a fabrication process subsequent to FIG. 2C, an encapsulant 23 is filled in the mold cavity 30a and the receiving space 20 and encapsulates the semiconductor element 221.

In another embodiment, as shown in FIG. 2C', when the encapsulant 23 is forming, the perforations 310 absorb the heat dissipating portion 211 by vacuum pumping.

In a method of fabricating a semiconductor package according to the present invention, the deformable supporting portions 212 allow the heat dissipating portion 211 to be tightly sealed to the upper mold 301, and no space is thus formed between the heat dissipating portion 211 and the upper mold 301. Accordingly, when the encapsulant 23 is formed, the encapsulant 23 will not flow to an external surface of the heat dissipating portion 211, thereby preventing a bleeding of encapsulant from occurring.

In an embodiment, even though flowing to a side surface of the heat dissipating portion 211, the encapsulant 13 will not continue to flow to the external surface of the heat dissipations 11.

In an embodiment, since the mold 30 is vacuum inside, the sealing between the heat dissipating portion 211 and the upper mold 301 is enhanced, which further prevents the bleeding of encapsulant from occurring.

Figure 2E:
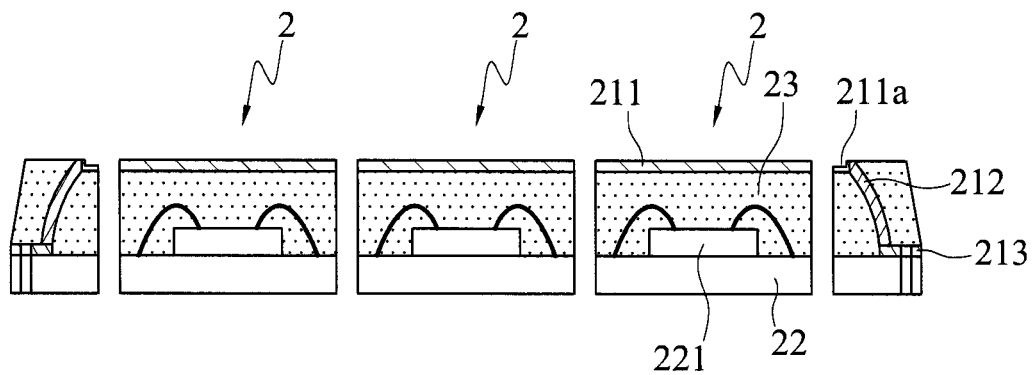

As shown in FIG. 2E, the mold 30 is removed, a singulation process is performed to fabricate a plurality of semiconductor packages 2, and the coupling portion 213 and the supporting portions 212 are removed.

In an embodiment, if the encapsulant 23 is going to flow to the external surface of the heat dissipating portion 211 for some reasons, the groove 211a limits the encapsulant to stay therein, not to flow further. During the singulation process, the groove 211a and the resin material formed therein can be removed. Therefore, no residual encapsulant 23 will stay on the heat dissipating portion 211 of the semiconductor package 2. Accordingly, the groove 211a can be the edge of the cutting path, for the cutting process to be performed smoothly.

In a method of fabricating a semiconductor package according to the present invention, the use of the supporting portions of the heat dissipating structure enhances the sealing between the heat dissipating portion and the mold and solves the problem that the encapsulant bleeds during the fabrication process.

Besides, the supporting portions can change the height of the semiconductor package before packaged according to the space of the mold. Therefore, the method of fabricating a semiconductor package according to the present invention can be applied to a variety of packaging machines.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A method of fabricating a semiconductor package, comprising:

providing a heat dissipating structure having a heat dissipating portion, a deformable supporting portion coupled to the heat dissipating portion, and a coupling portion coupled to the supporting portion;

attaching the coupling portion of the heat dissipating structure to a carrier having a semiconductor element disposed thereon to form a receiving space between the carrier and the heat dissipating portion for the semiconductor element to be received therein; and forming an encapsulant in the receiving space to encapsulate the semiconductor element and to deform the supporting portion, wherein the encapsulant is formed in a mold, and the mold has a mold cavity less than the heat dissipating structure in height, such that the encapsulant is free from flowing to an external surface of the heat dissipating portion.

2. The method of claim 1, further comprising, after forming the encapsulant, removing the coupling portion and the supporting portion.

3. The method of claim 1, wherein the heat dissipating portion has a groove.

4. The method of claim 1, wherein a side of the coupling portion protrudes from a side of the heat dissipating portion.

5. The method of claim 1, wherein a side of the coupling portion is flush with a side of the heat dissipating portion.

6. The method of claim 1, wherein the mold has a clamping portion that clamps the carrier and the coupling portion.

7. The method of claim 1, wherein the mold has a plurality of perforations that absorb the heat dissipating portion of the heat dissipating structure by vacuum-pumping when the encapsulant is formed.

8. The method of claim 1, wherein the coupling portion has a first positioning portion, and the carrier has a second positioning portion corresponding to the first positioning portion.

* * * * *